United States Patent [19]

Hsue et al.

[11] Patent Number: 4,841,240

[45] Date of Patent: Jun. 20, 1989

[54] METHOD AND APPARATUS FOR VERIFYING THE CONTINUITY BETWEEN A CIRCUIT BOARD AND A TEST FIXTURE

[75] Inventors: Ching-Wen Hsue; Wha-Joon Lee, both of Lawrenceville, N.J.

[73] Assignee: American Telephone and Telegraph Company, AT&T Bell Laboratories, Murray Hill, N.J.

[21] Appl. No.: 149,829

[22] Filed: Jan. 29, 1988

[51] Int. Cl.[4] .................. G01R 1/04; G01R 31/02
[52] U.S. Cl. .................... 324/158 P; 324/73 PC; 324/133; 324/537
[58] Field of Search .................. 307/246, 300, 350; 361/212; 320/1; 324/73 PC, 500, 522, 525, 537, 538, 543, 555, 64, 66, 133

[56] References Cited

U.S. PATENT DOCUMENTS

| | | | |
|---|---|---|---|
| 3,427,534 | 2/1969 | Maxwell | 324/127 |
| 4,025,850 | 5/1977 | Spiteri | 324/133 |
| 4,101,826 | 7/1978 | Horsitmann | 324/133 |
| 4,289,975 | 9/1981 | Rolfe | 307/246 |
| 4,292,586 | 9/1981 | Longmuir et al. | 324/73 |
| 4,406,985 | 9/1983 | Phillips et al. | 324/543 |
| 4,463,310 | 7/1984 | Whitley | 324/537 |
| 4,503,390 | 3/1985 | Wells, Jr. | 324/555 |
| 4,508,405 | 4/1985 | Damon et al. | 339/75 |

FOREIGN PATENT DOCUMENTS

| | | | |
|---|---|---|---|
| 0008870 | 1/1977 | Japan | 324/538 |
| 0012562 | 2/1981 | Japan | 324/538 |
| 0661412 | 5/1979 | U.S.S.R. | 324/525 |

Primary Examiner—Reinhard J. Eisenzopf
Assistant Examiner—W. Burns
Attorney, Agent, or Firm—Robert B. Levy

[57] ABSTRACT

A determination of whether each of a pair of interconnected nodes (22) on a circuit board (12) is connected to a corresponding one of a pair of nodes (28) on a translator board (14) via a test fixture pin (18) is had by coupling one of the translator board nodes to circuit ground. The other of the pair of nodes on the translator board is coupled to the gate of a field effect transistor (FET) (34) whose gate-to-source portion is shunted by a capacitor (38). The drain-to-source portion of the FET (34) is coupled in series with a resistor (36) between circuit ground and a voltage source supplying a potential below ground potential. When continuity exists between each of the pair of nodes (22 and 28) and each of the pair of pins (18), the FET(34) conducts, causing the voltage across the resistor (36) to change. By monitoring the voltage across the resistor (36), an indication can be had as to whether continuity exists.

8 Claims, 3 Drawing Sheets

TO
AUTOMATIC
TESTING
MACHINE

METHOD AND APPARATUS FOR VERIFYING THE CONTINUITY BETWEEN A CIRCUIT BOARD AND A TEST FIXTURE

TECHNICAL FIELD

This invention relates generally to the field of testing electronic circuit boards by connecting the board to a testing machine via a test fixture.

BACKGROUND ART

In the electronics industry, testing of circuit boards is done routinely to verify that the board, when populated with components, functions properly. Such testing is usually accomplished by placing the circuit board on a test fixture having a plurality of double-ended pins, each having a first end adapted to contact a selected node on the undersurface of the circuit board. The other end of each pin is electrically connected to an automatic testing machine, known in the art, which tests a circuit board by launching test signals therein via the test fixture and then sensing the signals returned from the board in response to the test signals. By monitoring the level of the signals returned from the circuit board, an indication can be had as to whether the circuit board is functioning properly.

Proper testing of a circuit board demands that there be a solid electrical connection between the nodes on the circuit board and the pins of the test fixture. Otherwise, proper communication of signals between the circuit board and the testing machine will not occur. The lack of a good connection between even one of the pins on the test fixture and one of the nodes on the circuit board may cause a good board to be found faulty, or worse, a defective board to be found good.

In the past, verification of continuity between the circuit board and the test fixture has been accomplished by injecting a dc voltage into one of a pair of test fixture pins while the other pin of the pair is grounded. When each of the pair of pins contacts a separate one of a pair of nodes on the circuit board connected to each other by a circuit path created by one or more components on the board, then current passes between the pins. The presence of a current passing between the two pins indicates that each pin of the pair is in contact with a corresponding one of a pair of nodes on the circuit board. Continuity between every other pair of test fixture pins and pair of corresponding nodes on the circuit board is tested in the same way.

Unfortunately, the above approach does not always yield accurate results. Even when each of a pair of test fixture pins contacts a separate one of a pair of nodes, very little current may pass between the pins if the nodes on the circuit board are interconnected by one or more very high impedance components. Thus, the absence of a meaningful current passing between a pair of pins will indicate the lack of continuity between the pins and the nodes on the circuit board even when such is not the case.

Therefore, a technique is needed for correctly sensing whether each of a pair of pins of a test fixture is in contact with each of a pair of nodes on a circuit board even when the nodes are interconnected by a high impedance circuit path.

BRIEF SUMMARY OF THE INVENTION

Briefly, verification of continuity between each of a pair of test fixture pins and each of a pair of interconnected nodes on a circuit board is accomplished by first coupling one pair of the test fixture pins to a first potential (e.g., circuit ground). The other of the pair of test fixture pins is selectively coupled to the gate of a field effect transistor (FET) whose gate-to-source portion is shunted by a capacitor. The drain-to-source portion of the FET is coupled in series with a resistor between circuit ground and a voltage source of a potential less than the first potential.

When each of the two test fixture pins is in contact with each of the two nodes on the circuit board, the voltage across the capacitor exceeds the threshold voltage of the FET. The FET now conducts so that a voltage $V_o$ appears across the resistor. If either one of the test fixture pins fails to contact its corresponding node, then the voltage at the gate of the FET falls below the threshold value for the device, causing the FET to become non-conductive. Hence, little if any voltage appears across the resistor. By monitoring the voltage across the resistor, for example, by coupling a voltmeter or other indicating device thereto, an indication can be had as to whether a pair of the test fixture pins is in contact with each of a pair of interconnected nodes on the circuit board.

The advantage associated with the instant technique is that the continuity between the nodes and the test fixture pins can be verified even if the nodes are interconnected by a very high impedance. The reason for this is that the FET has a very high input impedance at its gate terminal which is usually much higher than the impedance of the circuit path between each of the pair of interconnected nodes. Thus, when the test fixture pins are in contact with nodes on the circuit board, a voltage (in excess of the threshold voltage) appears across the gate-to-source junction of the FET. Under these conditions, the gate-source voltage will be larger than the voltage across the circuit path between the nodes. In this way, the conductivity of the FET is assured, notwithstanding the impedance of the circuit path between the nodes.

DETAILED DESCRIPTION

Figure 1:
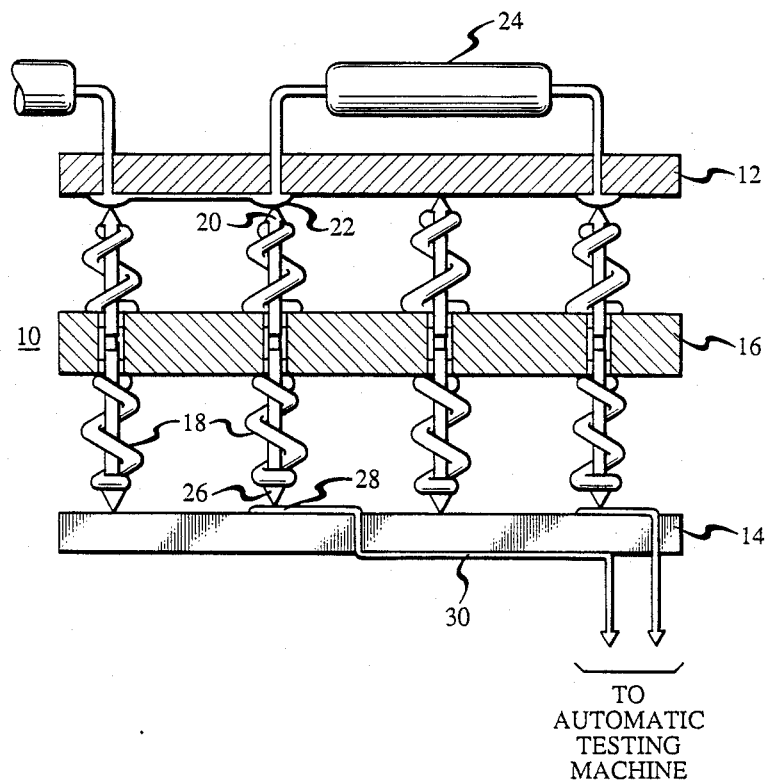
FIG. 1 is a side view, in cross section, of a prior art bed of nails type test fixture for coupling a circuit board to a translator board.

FIG. 1 is a cross-sectional view of a prior art test fixture 10 of the "bed of nails" type for coupling a circuit board 12 to a translator board 14 which in turn is electrically connected to an automatic circuit board testing machine (not shown) of the type which is well known in the art. The test fixture 10 is comprised of an insulative substrate 16 which holds a plurality of double-ended, spring-loaded, electrically conductive pins 18 that extend beyond each of the major surfaces of the substrate. Each pin 18 has a first end 20 adapted for electrical and mechanical contact with a separate one of a plurality of nodes 22 on the undersurface of the circuit board 12. Each node 22 is typically coupled to at least one other node on the circuit board 12 via a circuit path formed by one or more electronic components 24 carried by the circuit board.

Each of the pins 18 has a second end 26 adapted for electrical and mechanical contact with a separate one of a set of nodes 28 on the translator board 14. The nodes 28 on the translator board 14 are each coupled via a separate one of a set of conductors 30 to the automatic testing machine. The automatic testing machine serves to test the circuit board 12 by launching test signals therein via the translator board 14 and the test fixture 10, and then monitoring the level of each response signal returned by the circuit board once the test signals have been launched therein.

Accurate testing of the circuit board 12 demands that the pins 16 each have their ends 20 and 26 in electrical contact with a separate one of the nodes 22 and 28, respectively, on the circuit board and the translator board 14, respectively. Otherwise, one or more signals may not be communicated between the circuit board 12 and the automatic testing machine which may cause an error in testing to occur. Even if only one of the pins 18 of the test fixture 10 fails to make contact with the appropriate one of the nodes 22 and 28, then an erroneous test result will likely occur.

Figure 2:
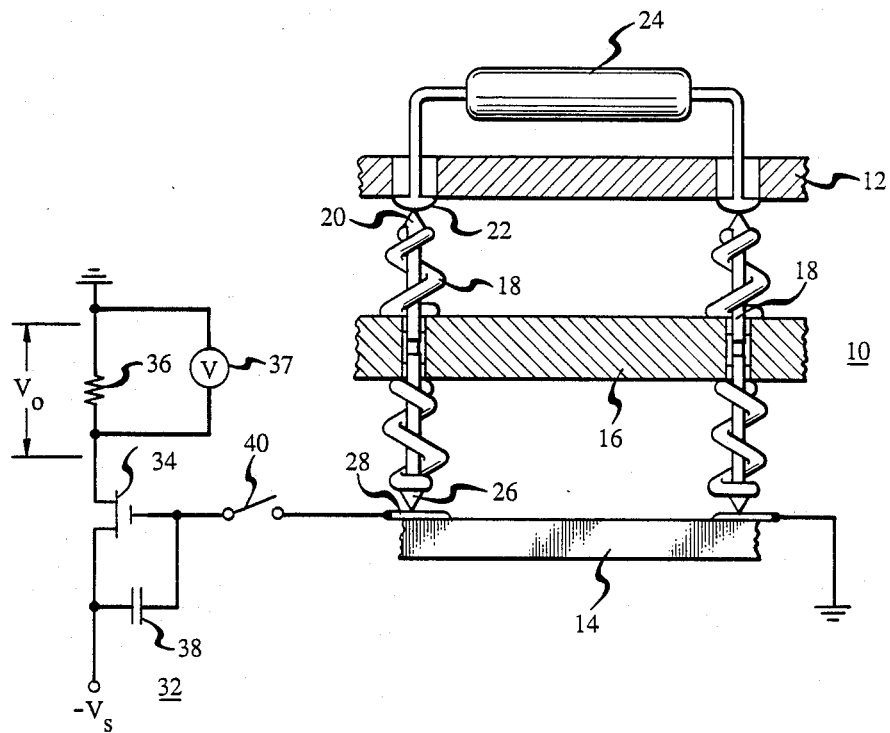
FIG. 2 is an illustration of the test fixture and circuit board of FIG. 1 which further shows a circuit for verifying continuity between the test fixture and circuit board.

Referring to FIG. 2, there is shown a circuit 32, in accordance with the present invention, for verifying the continuity (i.e., the electrical contact) between each of a pair of the pins 18, and a corresponding pair of the nodes 22 and 28. The circuit 32 comprises an enhancement n-channel MOS-type field effect transistor (FET) 34 having its drain-to-source portion coupled in series with a resistor 36 between circuit ground and a voltage source (not shown) which supplies a voltage $V_s$, typically 4—volts dc. A small dc blocking capacitor 38 is coupled between the gate and the source of the FET 34. In practice, the capacitor 38 is selected such that its impedance is less than the lowest expected impedance of each circuit path coupling a separate pair of the nodes 22 on the circuit board 12.

A switching device 40, which may either take the form of a manually operated, single-pole, single-throw switch, as shown, or an electrically controlled device, such as a relay, for example, selectively couples the gate of the FET 34 to one of the nodes 28 on the translator board 14 expected to be coupled to a corresponding node 22 on the circuit board 12 via one of the pins 18. Another of the nodes 28 on the translator board 14, expected to be coupled to a different one of the nodes 22 on the circuit board 12 via a different one of the pins 18, is coupled to a first (e.g., ground) potential. As described previously, the nodes 22 on the circuit board 12 are typically interconnected by one or more of the components 24 carried by the board. Thus, closing the switching device 40 causes the gate of the FET 34 to be grounded through one or more of the components 24 for so long as each of a pair of the nodes 22 is coupled via a separate one of the pins 18 to the FET gate and circuit ground, respectively.

While the gate of the FET 34 remains grounded, a potential in excess of the threshold voltage of the FET 34 appears across the capacitor 38, and hence the gate-to-source portion of the FET. The FET 34 now becomes conductive, causing a voltage of $V_o$ to appear across the resistor 36. If, while the switching device 40 is closed, either of the two nodes 28 coupled to the gate of the FET 34 and to circuit ground, respectively, is not connected to a separate one of the nodes 22 via a corresponding one of the pins 18, then the gate of the FET won't be grounded. Assuming that the capacitor 38 discharges almost instantaneously, then the voltage across the gate and source of the FET 34 becomes insufficient to render the FET conductive in the absence of a connection between the circuit board 12 and the translator board 14. Consequently, the voltage across the resistor 36 falls from $V_o$ to approximately zero volts. Thus, the level of the voltage across the resistor 36 provides an indication of whether each of a selected pair of the fixture pins 18 is in contact with a corresponding one of a pair of the nodes 22 and 28. A voltmeter 37, or some other type of voltage-indicating device, may be coupled to the resistor 36 to signal when the voltage thereacross reaches the value $V_o$.

Once the continuity between each of a pair of the pins 18 and each of a pair of the nodes 40 is verified in the above described manner, then the switching device 40 is opened. Thereafter, another one of another pair of the nodes 26 on the translator board 14 is coupled to the gate of the FET 34 via the switching device 40 while the other node of this pair is grounded as before. Again, the voltage across the resistor 36 is monitored to determine whether continuity exists between the pair of the nodes 28 and each of a corresponding pair of nodes 22 on the circuit board 12, via a pair of the pins 18. This process is repeated until the continuity has been verified between every pair of nodes 28 and every corresponding pair of nodes 22.

In describing the operation of the circuit 32, the capacitor 38 is assumed to discharge instantaneously. However, in reality, the time constant for the discharge of the capacitor 38 is usually large. As a result, a sufficient charge may remain on the capacitor 38 to render the FET 34 conductive long after the connection between the gate of the FET and circuit ground has been severed by opening the switching device 40. Consequently, even when the FET 34 is coupled to one of the nodes 28 that is not electrically connected to a node 22, the FET may still be conductive. Hence, a voltage $V_o$ appears across the resistor 36 even though no continuity exists.

Figure 3:
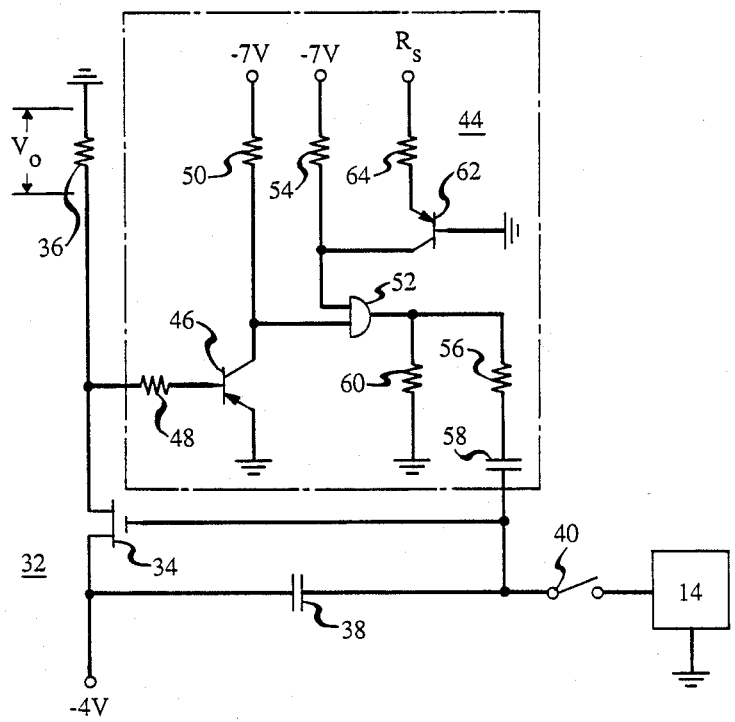
FIG. 3 is a schematic diagram of an alternative embodiment of the fixture verification circuit of FIG. 2.

The problem of charge remaining on the capacitor 38 can be avoided by modifying the circuit 34 of FIG. 2 in the manner shown in FIG. 3 to incorporate a discharge circuit 44 for discharging the capacitor. As seen in FIG. 3, the discharge circuit 44 includes a first PNP bipolar junction transistor 46 which has its base coupled via a resistor 48 to the junction of the drain of the FET 34 and the resistor 36. The emitter-to-collector portion of the transistor 48 is coupled in series with a resistor 50 between circuit ground and a voltage source, (not shown) which supplies a potential of −7 volts dc.

The transistor 48 has its collector coupled to a first input of a two input AND gate 52. A resistor 54 couples a second input of the AND gate 52 to the same voltage source which supplies the −7 volt voltage to the collector of the transistor 46. The AND gate 52 has its output coupled through the series combination of a resistor 56 and a capacitor 58 to the gate of the FET 34. The output of the AND gate 52 is also coupled to circuit ground via a resistor 60. The AND gate 52 has its second input coupled to the collector of a second PNP bipolar junction transistor 62. The transistor 62 has its base coupled to circuit ground. A resistor 64 couples the emitter of the transistor 62 to a signal generator (not shown) which generates a signal $R_s$ whose logic level follows the conductivity state of the switching device 40.

The discharging circuit 44 shown in FIG. 3 operates in conjunction with the circuit 32 as follows. If no continuity is found between a pair of the nodes 22 and a pair of nodes 28 (see FIG. 2) after the switching device 40 has been closed, then the voltage across the capacitor 38 remains much smaller than the threshold voltage of the FET 34. Hence, the FET 34 is substantially non-conductive, and no discharging of the capacitor 38 is required.

However, should continuity be found after the switching device 40 is closed, then the voltage across the capacitor 38 becomes much larger than the threshold voltage of the FET. Under these conditions it is necessary to discharge the capacitor 38 once the switching device 40 is opened. Such discharging occurs automatically once the switching device 40 has been opened, because the signal $R_s$, whose logic state follows the conductivity state of the switching device, changes from a logic "high" to a logic "low" state. As a result, the transistor 62 becomes cut off.

Once the transistor 62 becomes cut off, the signal at the second of the inputs to the AND gate 52 now changes to a logic "low" level. Consequently, the output signal of the AND gate 52 changes to a logic "low" level. This change in the level of the output signal of the AND gate 52 allows the capacitor 38 to now discharge through the resistor 56 and the capacitor 58. After the capacitor 38 has discharged itself, then the voltage across the gate and source of the FET 34 no longer exceeds the threshold voltage so that the FET now becomes substantially non-conductive. The above-described operation of the discharging circuit 44 assures that the FET 34 is rendered substantially non-conductive when the switching device 40 is opened.

Not only does the discharge circuit 44 advantageously solve the problem of providing a discharge path for the capacitor 38, the discharge circuit does not degrade the operation of the FET 34. During the interval that the transistor 46 is substantially non-conductive, the AND gate 52 has a high impedance, and thus does not significantly reduce the drain impedance of the FET.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for verifying whether each of a pair of conductive members is in electrical contact with a separate one of a pair of interconnected nodes on a body, CHARACTERIZED IN THAT:
   (a) a first one of the pair of conductive members is coupled to a first potential;
   (b) a second one of the pair of conductive members is selectively coupled to the gate of a field effect transistor whose source-to-gate portion is shunted by a capacitor and whose drain-to-source portion is coupled in series with a voltage indicator between ground and a voltage source of a potential less than said first potential; and
   (c) the voltage indicator is monitored to determine whether the field effect transistor is conductive as will occur when an electrical circuit path exists between the pair of conductive members by virtue of each being in contact with a separate one of the interconnected nodes on the body.

2. The method according to claim 1, characterized in that the steps (a), (b) and (c) are repeated to verify whether each of a successive pair of conductive members is in electrical contact with a separate one of another pair of interconnected nodes on the body.

3. The method according to claim 2, characterized in that prior to successively repeating each of the steps (a), (b) and (c), the capacitor is discharged.

4. A method for successively verifying whether each of a separate one of a plurality of pairs of conductive members is in contact with a separate one of a plurality of pairs of interconnected nodes on a body, characterized in that:
   (a) a first one of a first pair of conductive members is coupled to a first potential;
   (b) a second one of the first pair of conductive members is selectively coupled to the gate of a field effect transistor whose source-to-gate portion is shunted by a capacitor and whose drain-to-source portion is coupled in series with a resistor between ground and a voltage source of a potential less than said first potential;
   (c) the voltage across the resistor is monitored to determine whether the field effect transistor is conductive as occurs when each of the first pair of conductive members is in contact with a separate one of the first pair of interconnected nodes so that an electrical circuit path exists between the first pair of conductive members;
   (d) the capacitor is discharged after the field effect transistor has become conductive; and
   (e) the steps of (a), (b), (c) and (d) are successively repeated to verify the continuity between another pair of conductive members and another pair of nodes on the body.

5. A circuit for indicating whether each of a pair of conductive members is in electrical contact with each of a pair of interconnected nodes on a body, even when the nodes are connected by a high-impedance circuit path, characterized in that said circuit comprises:
   a field effect transistor having a drain, gate and source;
   a capacitor coupled between the gate and source of the field effect transistor;
   means for selectively coupling the gate of the FET to one of the pair of conductive members while the other of the pair of members is coupled to a first potential; and
   a resistor coupled in series with the drain-to-source portion of the field effect transistor between circuit ground and a voltage source of a potential less than said first potential, the resistor carrying a voltage thereacross whose magnitude changes when the FET becomes conductive which occurs when each of the conductive members is in contact with a separate one of the interconnected nodes, notwithstanding the impedance of the circuit path connecting the nodes.

6. The apparatus according to claim 5, characterized in that means are provided to discharge the capacitor after the FET has been rendered conductive.

7. A circuit for indicating whether each of a pair of conductive members is in electrical contact with each of a pair of interconnected nodes on a body, even if the nodes are connected to each other by a high-impedance circuit path, characterized in that the circuit comprises:
   a field effect transistor having a gate, drain and source;

a capacitor coupled between the gate and source of the field effect transistor;

means for selectively coupling the gate of the FET to one of the pair of conductive members while the other of the pair of members is coupled to a first potential;

a resistor coupled in series with the drain-to-source portion of the field effect transistor between circuit ground and a voltage source of a potential less than said first potential, the resistor carrying a voltage thereacross whose magnitude changes when the FET becomes conductive, which occurs when each of the conductive members is in contact with a separate one of the interconnected nodes; and means for discharging the capacitor after the FET has been rendered conductive, said means including:

an AND gate having a pair of inputs and an output, the output being coupled to said capacitor;

means for coupling a first of the inputs of the AND gate to a second voltage source of a predetermined magnitude, when the voltage across the resistor exceeds a threshold value; and means for selectively coupling a second input of said AND gate to the second voltage source, thereby enabling the AND gate, when both of its inputs are coupled to the second voltage source, to provide a path for the capacitor to discharge.

8. The apparatus according to claim 7, characterized in that means are coupled to the resistor for indicating the voltage appearing thereacross.

* * * * *